United States Patent [19]

Sako

[11] Patent Number: 5,258,891
[45] Date of Patent: Nov. 2, 1993

[54] MULTICHIP MODULE WITH MULTILAYER WIRING SUBSTRATE

[75] Inventor: Norimitsu Sako, Chiba, Japan

[73] Assignee: Kawasaki Steel Corporation, Hyogo, Japan

[21] Appl. No.: 797,920

[22] Filed: Nov. 26, 1991

[30] Foreign Application Priority Data

Nov. 29, 1990 [JP] Japan .................. 2-332130

[51] Int. Cl.$^5$ .............................. H05K 1/14
[52] U.S. Cl. ................... 361/792; 174/254; 257/700; 361/744; 361/767
[58] Field of Search .............. 361/400, 403, 410, 411, 361/414, 418, 396, 380; 257/686, 700; 174/254, 261; 307/202.1

[56] References Cited

U.S. PATENT DOCUMENTS

| | | | |
|---|---|---|---|
| 4,598,166 | 7/1986 | Neese | 174/68.5 |
| 4,685,033 | 8/1987 | Inoue | 361/414 |
| 4,739,448 | 4/1988 | Rowe et al. | 361/386 |
| 4,782,193 | 11/1988 | Linsker | 174/68.5 |
| 4,795,670 | 1/1989 | Nishigaki et al. | 428/209 |

FOREIGN PATENT DOCUMENTS

0206337 12/1986 European Pat. Off. .
2-146745 6/1990 Japan .
85/03805 8/1985 PCT Int'l Appl. .

OTHER PUBLICATIONS

L. H. Hyden et al., "Silicon Circuit Boards Off-the-Shelf Convenience", Electronic Packaging & Production, vol. 28, No. 4, Apr. 1988.

Y. C. Lee, "Design of HWSI Multichip Modules for Quick Prototyping and Manufacturing", 40th Electronic Components & Technology Conference, pp. 586-591.

E. M. Hubacher, "Low Cost Multi-Chip Package", IBM Technical Disclosure Bulletin, vol. 27, No. 4B, Sep. 1984.

*Primary Examiner*—Leo P. Picard
*Assistant Examiner*—Young Whang
*Attorney, Agent, or Firm*—Oliff & Berridge

[57] ABSTRACT

Multichip module is provided with standard wiring layers comprising standardized wiring patterns, a custom wiring layer comprising customized wiring patterns and chip mounting pads, a plurality of antifuses which are positioned in standardized installation positions and each of which provides the possibility of defining the presence or absence of an electrical connection between a specified conductive track of a standard wiring layer and a specified conductive track of the custom wiring layer, and a plurality of wafer chips which are electrically connected to the chip mounting pads and mounted on the chip mounting pads, whereby disadvantages of hybrid integrated circuits are overcome while offering numerous advantages of hybrid integrated circuits.

10 Claims, 12 Drawing Sheets

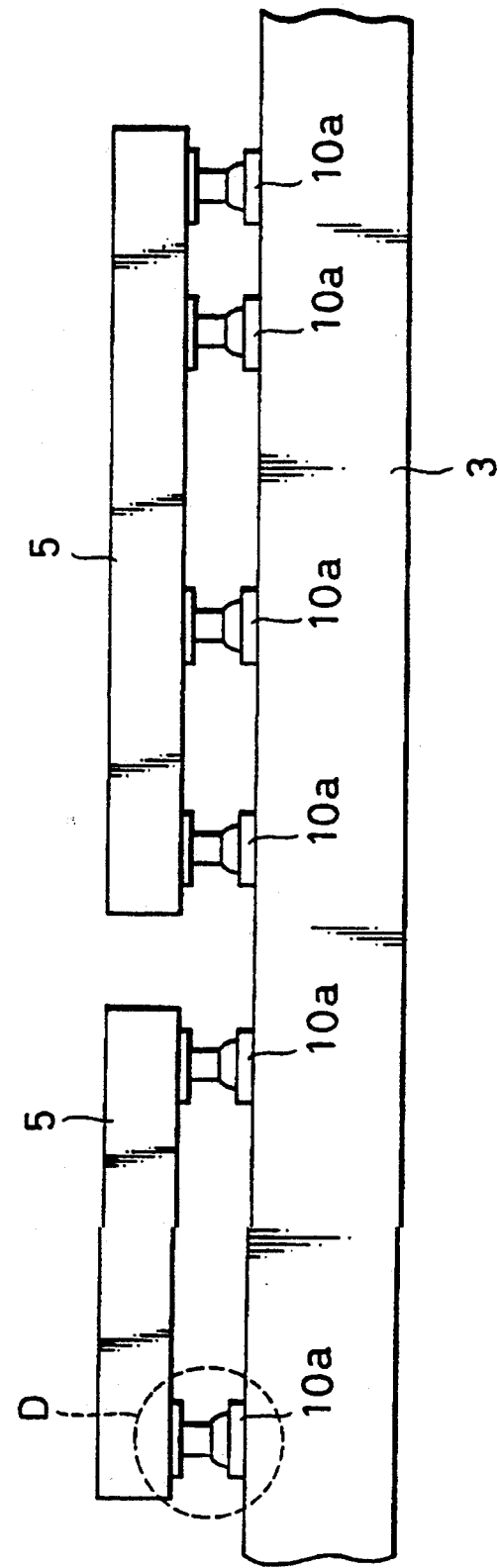

MULTICHIP MODULE WITH MULTILAYER WIRING SUBSTRATE

BACKGROUND OF THE INVENTION

1. Field of the Invention

The present invention relates to the integration of an electronic circuit. More particularly, the present invention relates to a multichip module comprising a plurality of wafer chips.

2. Description of the Prior Art

Circuit integration of electronic equipment not only provides the possibility of miniaturizing the size of entire electronic apparatuses, but it also offers numerous advantages including improvement in the reliability and reduction of the power consumption of electronic equipment. Accordingly, circuit integration of digital circuits which perform logical operations of binary numbers as well as circuit integration of various types of analog circuits has been attempted.

An integrated circuit which integrates only digital circuits is called a digital integrated circuit. On the other hand, an integrated circuit which integrates only analog circuits is called an analog integrated circuit.

Furthermore, in such digital and analog integrated circuits, an integrated circuit which is integrated on a single wafer chip is called a monolithic integrated circuit.

Monolithic integrated circuits not only provide the possibility of drastically miniaturizing electronic circuits, but also allow improvement of reliability, reduction of power consumption, and the like.

Also, an integrated circuit which integrates a mixture of more than one digital or analog integrated circuit (wafer chip) and, as required, other devices or parts, is called a hybrid integrated circuit.

Compared with monolithic integrated circuits, hybrid integrated circuits allow efficient development of circuit integration of large-scale electronic circuits in a relatively short period of time. Furthermore, hybrid integrated circuits also provide an easy way to realize integrated circuits which use a combination of different processes, such as the accommodation of bipolar analog integrated circuits and CMOS (complementary metal-oxide-semiconductor) digital integrated circuits in the same package.

However, problems such as the relative difficulty of development of integrated circuits of the desired electronic circuits, a longer period of development and higher development costs have been associated with the above-described monolithic integrated circuits.

These problems become especially significant as the scale of the electronic circuits, which are to be integrated, increase.

Furthermore, the difficulty in realizing a change in the design (change in the circuit) is another problem with the above-described monolithic integrated circuits. The need for a major design change involves the problem that the costs and the period of time required for the design change are equal to the costs and time needed for an entirely new development. Development costs for an ordinary monolithic integrated circuit are said to amount to approximately 5 million yen.

In addition, higher process costs are a problem with monolithic integrated circuits when integrated circuits such as BiCMOS integrated circuits are fabricated by employing a different process.

Major circuit elements which are integrated into a single wafer chip are transistors, diodes and resistors. As these circuit elements are limited to those with relatively small capacities, electronic circuits which allow integration into monolithic integrated circuits are subject to numerous restrictions.

On the other hand, a problem concerning the above-described hybrid integrated circuits is a decline in reliability with regard to the conductive tracks which interconnect a plurality of wafer chips, namely, the digital or analog integrated circuits which compose the hybrid integrated circuit.

Another problem is that, due to the interconnecting conductive tracks between a plurality of wafer chips and the like, the mounting area increases, which in turn results in a decrease in the overall degree of integration.

Another issue is the difficulty of handling during production.

Compared with monolithic integrated circuits, the development of hybrid integrated circuits is easy. However, as with monolithic integrated circuits, a change in the design of hybrid integrated circuits is difficult. The need for a major change in the design of a hybrid integrated circuit involves the problem that a long period of time for the design change and high development costs are required. In general, the development costs for a hybrid integrated circuit are said to amount to approximately 1 million yen.

SUMMARY OF THE INVENTION

The present invention was carried out in order to solve the above-described existing problems. It is an object of the present invention to provide a multichip module which allows the relatively easy development of relatively large-scale electronic circuits whose development is difficult with monolithic integrated circuits, which realizes a module that allows integration of a combination of different processes, and which provides the possibility of reducing the period of development and development cost.

To achieve this object, the present invention provides a multichip module comprising a standard wiring layer with standardized wiring patterns, a custom wiring layer comprising customized wiring patterns as well as chip mounting pads, a plurality of connection defining means which are positioned in standardized installation positions and each of which provides the possibility of defining the presence or absence of an electrical connection between a specified conductive track of the standard wiring layer and a specified conductive track of the custom wiring layer, and a plurality of wafer chips which are electrically connected to the chip mounting pads and mounted on the chip mounting pads.

The object is also achieved by providing a plurality of the standard wiring layers and a plurality of the connection defining means which are positioned in standardized installation positions, and each of which provides the possibility of defining the presence or absence of an electrical connection between a specified conductive track of the custom wiring layer or one standard wiring layer from among the plurality of the standard wiring layers and a specified conductive track of a different standard wiring layer.

The object is also achieved by using antifuses as a means for defining connections.

Further, the object is achieved by providing the multichip module with a standardized active element as well.

The multichip module according to the present invention integrates in the same manner as conventional hybrid circuits a mixture of a plurality of wafer chips, that is, digital or analog integrated circuits and a plurality of devices and parts, and it offers numerous advantages of hybrid integrated circuits.

In addition to this, a multilayered wiring layer configuration in the multichip module according to the present invention aims to overcome the disadvantages of hybrid integrated circuits. That is, multilayered wiring layers not only improve the reliability of the wiring, but also allow the realization of complex connections of conductive tracks in an efficient way.

In addition, in the multichip module according to the present invention, the structure of the conductive tracks interconnecting the plurality of wafer chips, devices and parts, which compose the multichip module, is able to meet with requirements of multi-product, small-scale production. That is, according to the present invention, it is possible to readily design this kind of wiring and to readily make a design change.

The multichip module of the present invention comprises standard wiring layers with standardized wiring patterns as well as a custom wiring layer which comprises customized wiring patterns and customized chip mounting pads. In addition, the multichip module provides a plurality of connection defining means which are positioned in standardized installation positions and each of which provides the possibility of defining the presence or absence of an electrical connection between a specified conductive track of a standard wiring layer and a specified conductive track of the custom wiring layer. The definition of the presence or absence of an electrical connection can be made in accordance with the specified method of definition of the connection defining means. To be concrete, fuses, antifuses, and the like can be used as a means for defining connections.

A configuration mainly comprising the above-described standard wiring layers, the custom wiring layer and the means for defining connections will be hereinafter called a module board.

Among the plurality of wiring layers of the module board, the custom wiring layer is formed closest to the surface. Wafer chips, and the like can be mounted on the custom wiring layer by means of customized chip mounting pads.

Normally, to prevent malfunction caused by noise, it is necessary to provide the wafer chips and the like with power supply lines as thick and short as possible. The custom wiring allows these requirements to be met.

Accordingly, the formation of the customized wiring patterns and customized chip mounting pads (by etching, and the like) of the custom wiring layer is also possible during a later stage of the module board's manufacturing process.

Also, the conductive tracks on the module board give rise to points where it is necessary to electrically insulate a plurality of conductive tracks and make the conductive tracks cross each other.

In this case, using standard wiring layers with standardized wiring patterns facilitates the designing of the wiring so that a specified conductive track leaps over another conductive track. That is, it suffices to connect the conductive track, which is to leap, to the conductive tracks of the standardized wiring pattern by means of a connection defining means, to cross the conductive track, which is to be leaped over, using the standardized wiring pattern, and thereafter, to make connection to the customized wiring pattern once again by using another connection defining means.

Accordingly, the module board of the present invention's multichip module can be used for various multichip modules, and for each multichip module customization of the module board is readily made. Also, the configuration of such a module board provides sufficient reliability so that satisfactory reliability of the entire multichip module is achieved.

The standard wiring layer of the module board comprises standardized wiring patterns, and one standard wiring layer or a plurality of the standard wiring layers may be provided. For example, if the angle of the direction of the conductive tracks of each standard wiring pattern of the plurality of wiring layers is different, it is possible to wire the module board more unrestrictedly. What is more, the wiring length of each conductive track can be made shorter. Also, even after the design of the custom wiring layer is completed, using a plurality of standard wiring layers and the means for defining connections provides a relatively easy way to make change in the wiring. If a plurality of wiring layers are used, connection defining means for defining the presence or absence of electrical connections between the plurality of wiring layers should be provided.

Furthermore, the present invention does not impose any restrictions on the connection defining means. However, it is expected that among the numerous connection defining means on the module board, the number of means which will define the presence of an electrical connection will be smaller than the number of means which will define the absence of an electrical connection. Accordingly, it is desirable that the connection defining means of the module board should be such that the definition of the absence of an electrical connection can be made more easily than the definition of the presence of an electrical connection. Therefore, if antifuses are used as a means for defining connections, it suffices to make a relatively small number of electrical connection present definitions (create a conducting state), which allows the efficient making of definitions of all connection defining means of the entire multichip module.

Also, in the module board of the present invention, no restrictions are imposed on whether passive elements, such as registors, and/or active elements, such as transistors, are configured or not. However, the module board requires standardized active elements such as buffer gates for the inputs and outputs with the outside of the multichip module. Accordingly, installing active elements as well on the multichip module's module board provides the possibility of improving design efficiency of the multichip module.

In the embodiments described hereinunder, the standard wiring layers and the custom wiring layer of the present invention are aluminium wiring layers. However, the present invention is not restricted to only aluminium wiring layers. Any electrically conductive material which is suitable for the wiring can be used.

According to the present invention, a multichip module is provided, wherein it is relatively easy to develop relatively large-scale electronic circuits whose development is difficult with monolithic integrated circuits. Furthermore, the present invention realizes a module which allows the integration of a combination of different processes, reduces the development period and costs.

BRIEF DESCRIPTION OF THE DRAWINGS

The preferred embodiments will be described with reference to the drawings, wherein like elements have been denoted throughout the figures with like reference numerals, and wherein:

FIG. 2A is a partial side view of the embodiment;

DESCRIPTION OF THE PREFERRED EMBODIMENTS

Embodiments according to the present invention will be described in detail hereinunder with reference to the accompanying drawings.

Figure 1:
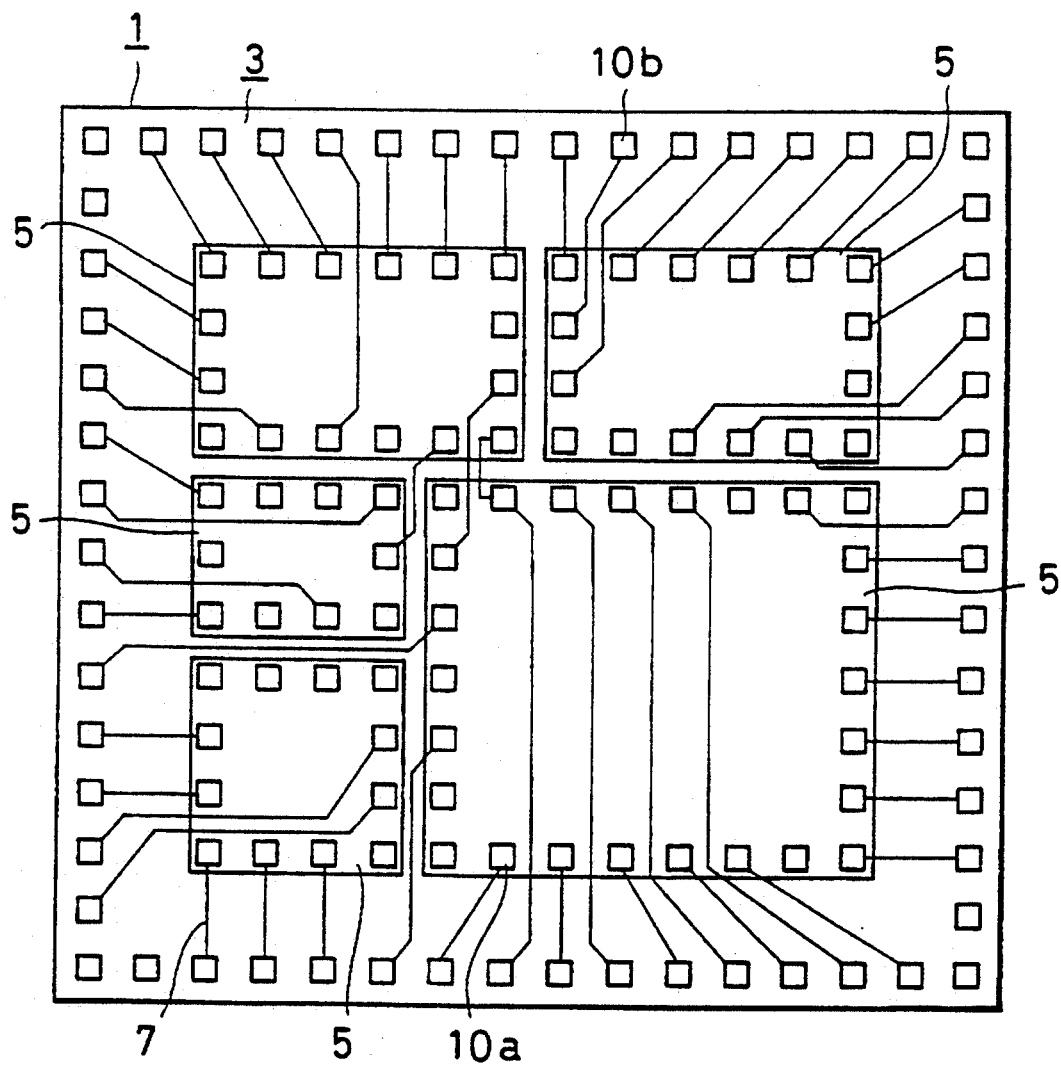
FIG. 1 is a top view of an embodiment of the present invention.

FIG. 1 is a top view of an embodiment according to the present invention.

In FIG. 1, a multichip module 1 comprises a module board 3 and a total of five chips 5 mounted on the module board 3.

The module board 3 is provided with module pins (not shown). The module pins provide the possibility of mounting the entire multichip module 1 on, for instance, a printed board and of making electrical connections.

The module board 3 is provided with module pads 10b so that the module pads 10b correspond to the module pins. The module pads 10b are electrically connected to the module pins. Accordingly, external connection to the multichip module 1 can be made by making wiring connections to the module pads 10b on the module board 3.

Furthermore, the module board 3 is provided with module pads 10a which are customized chip mounting pads.

In the embodiment, the installation positions of the module pads 10a are determined and customized in accordance with the type and size of the chips 5 which are to be mounted on module board 3.

Accordingly, there are no unnecessary module pads 10a on the module board 3. This allows wiring to be performed while unrestrictedly utilizing the space on the module board 3. However, if sufficient space is available for the conductive tracks on the module board 3, the positioning of the module pads 10a can also be standardized.

As will be described in detail and with reference to FIG. 2B hereinafter, the module pads 10a are used to make electrical connections for the chips 5 which are mounted on the module board 3.

Furthermore, on the module board 3, the interconnections of the module pads 10a, which are connected to the chips 5 mounted on the module board 3, and the connections between the module pads 10a and the module pads 10b, with the module pads 10b being connected to the module pins, are made by means of module board wiring 7, which is illustrated by solid lines.

As will be described in detail hereinafter, the module board wiring 7 has a multilayer wiring layer structure. That is, the module board wiring 7 comprises conductive tracks of standard wiring layers and conductive tracks of a custom wiring layer.

FIG. 2A is a partial side view of the embodiment according to the present invention.

In FIG. 2A, the numerals 3, 5 and 10a indicate the same parts that the same numerals of the above-described FIG. 1 indicate.

Figure 2B:
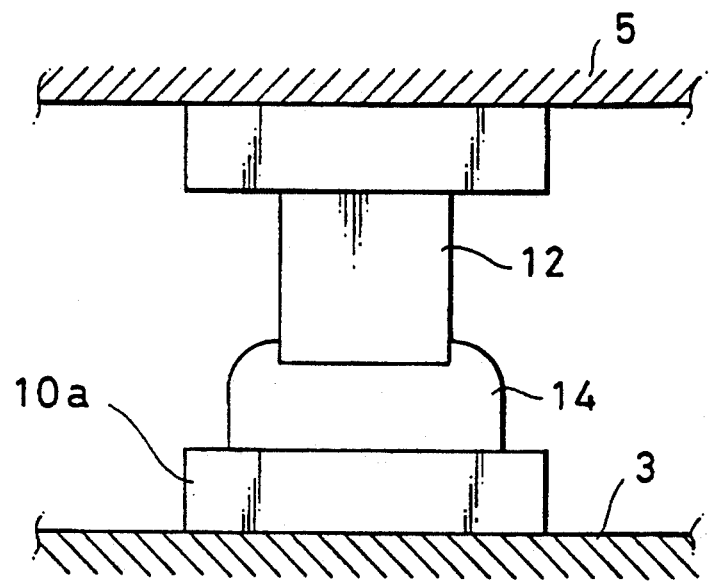
FIG. 2B is an enlarged view of the portion designated by the reference D in the side view of FIG. 2A.

FIG. 2B is an enlarged view of a portion where a chip and the module board are connected. That is, FIG. 2B is an enlarged view of the part designated by the reference D in the side view of FIG. 2A.

In FIG. 2B, the numerals 3, 5 and 10a indicate the same parts that the same numerals of the above-described FIG. 1 and FIG. 2A indicate.

In FIGS. 2A and 2B, the electrical connections between the module pads 10a on the module board 3 and the chips 5 mounted on the module board 3, and the fixation of the chips 5 are made by using bumps 12 of the chips 5 and an electrically conductive bond 14 which is applied to the module pads 10a on the module board 3. That is, after formation of the module pads 10a on the module board 3, a proper amount of the electrically conductive bond 14 is applied to the surface of the module pads 10a, then chips 5 are mounted, and thereafter, the electrically conductive bond 14 is allowed to harden.

Figure 3:
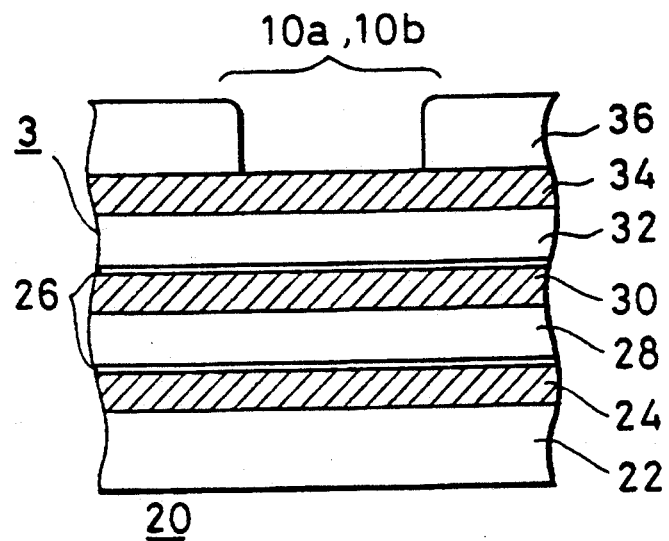
FIG. 3 is a cross-sectional model drawing showing the module board which is used in the first embodiment according to the present invention.
Figure 4:
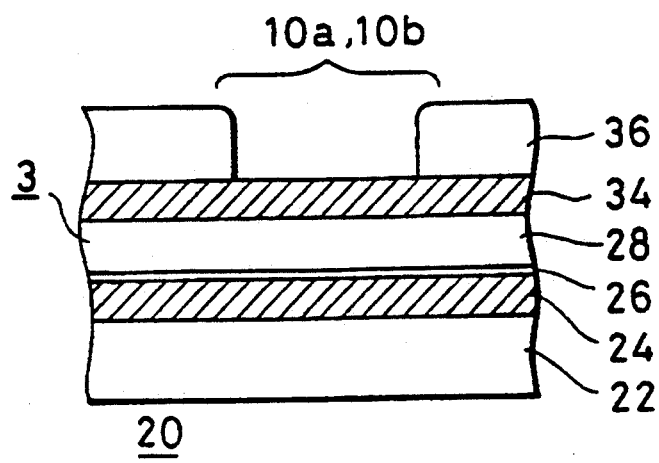
FIG. 4 is a cross-sectional model drawing showing the module board which is used in the second embodiment according to the present invention.

FIGS. 3 and 4 are cross-sectional model drawings showing the module boards used in the embodiments according to the present invention.

In FIG. 3, the lowest layer of module board 3 is a silicon substrate. Above the lowest layer, the following layers and films are formed according to the following order: a thick $SiO_2$ film 22, a first standard aluminium wiring layer 24, a thin $SiO_2$ film 26, a first inter-layer film 28, a second standard aluminium wiring layer 30, a thin $SiO_2$ film 26, a second inter-layer film 32, a custom aluminium wiring layer 34 and a passivation film 36.

The standard wiring layers of the module board 3 in FIG. 3 comprises two layers. That is, the module board 3 in the FIG. 3 is provided with the first standard aluminium wiring layer 24 and the second standard aluminium wiring layer 30.

An embodiment of the multichip module comprising two of such standard wiring layers will be hereinafter called the first embodiment according to the present invention.

On the other hand, the module board 3 in FIG. 4 comprises only one standard wiring layer. That is, the standard wiring layer of the module board 3 in FIG. 4 comprise only the standard aluminium wiring layer 24 and do not comprise the second standard aluminium wiring layer 30.

That is, the lowest layer of module board 3 in FIG. 4 is a silicon substrate. Above the lowest layer, the following layers and films are formed according to the following order: a thick $SiO_2$ film 22, the standard aluminium wiring layer 24, a thin $SiO_2$ film 26, an interlayer film 28, a custom aluminium wiring layer 34 and a passivation film 36.

An embodiment of the multichip module which uses a module board comprising only one standard wiring layer, as shown in FIG. 4, will be hereinafter called the second embodiment according to the present invention.

In FIG. 3 and FIG. 4, numerals 10a and 10b indicate module pads. Here, the custom aluminium wiring layer 34 is exposed.

FIG. 3 and FIG. 4 are intended to be model drawings only. Cross sections of each portion of the module board 3 may have a structure different from that shown in FIG. 3 or FIG. 4. That is, the cross section of one portion may not comprise the custom aluminium wiring layer 34, the cross section of another portion may not comprise the first standard aluminium wiring layer 24, and so on. Namely, FIG. 3 and FIG. 4 are model drawings intended to illustrate the structure of the module board 3 in order from the lowest layer, which is a silicon substrate.

Each aluminium wiring layer the module board is composed of will be hereinafter called in order from the lowest layer, which is a silicon substrate, the aluminium wiring layer AL1, the aluminium wiring layer AL2 and the aluminium wiring layer AL3, respectively.

That is, in the first embodiment according to the present invention shown in FIG. 3, the first standard aluminium wiring layer 24 is the aluminium wiring layer AL1, the second standard aluminium wiring layer 30 is the aluminium wiring layer AL2, and the custom aluminium wiring layer 34 is the aluminium wiring layer AL3.

On the other hand, in the second embodiment according to the present invention shown in FIG. 4, the standard aluminium wiring layer 24 is the aluminium wiring layer AL1 and the custom aluminium wiring layer 34 is the aluminium wiring layer AL2.

Figure 5:
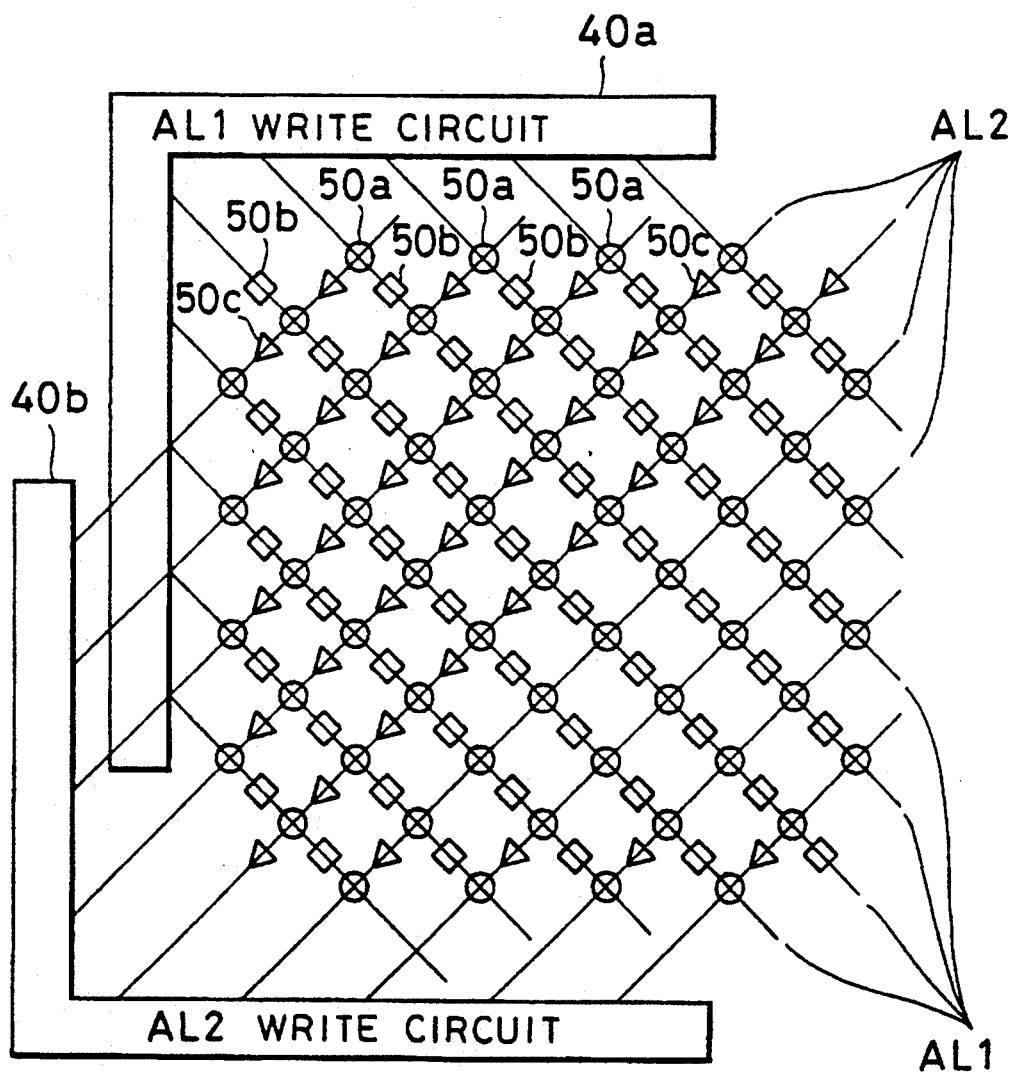
FIG. 5 shows a circuit diagram for the conductive tracks of the aluminium wiring layer AL1 and aluminium wiring layer AL2 of the first embodiment.

FIG. 5 shows a circuit diagram for the aluminium wiring layer AL1 and the aluminium wiring layer AL2 of the first embodiment according to the present invention.

In FIG. 5, the aluminium wiring layer AL1 is arranged in straight lines which decline toward the right side and which are spaced at equal distances. On the other hand, aluminium wiring layer AL2 is arranged in straight lines which decline toward the left side and which are spaced at equal distances. In FIG. 5, aluminium wiring layer AL3 is not shown. It is, however, assumed that the aluminium wiring layer AL3, which is the custom wiring layer comprising the customized wiring patterns and the chip mounting pads, exist.

At the points of intersection between each conductive track of the aluminium wiring layer AL1 and each conductive track of the aluminium wiring layer AL2, inter AL1-AL2 antifuses 50a are positioned, as illustrated by circular marks. Furthermore, inter AL1-AL3 antifuses 50b are positioned, as illustrated by square marks, between the inter AL1-AL2 antifuses 50a illustrated by the circular marks on each conductive track of the aluminium wiring layer AL1. Inter AL2-AL3 antifuses 50c are positioned, as illustrated by triangular marks, between the inter AL1-AL2 antifuses 50a illustrated by the circular marks on each conductive track of the aluminium wiring layer AL2.

The initial state of the antifuses 50a-50c is the insulated state. However, the antifuses 50a-50c are elements which allow, through application of a specified voltage, to define the presence of an electrical connection. If the thickness of the thin $SiO_2$ film 26 is 150 angstrom, the program voltage required for this definition is 12.5 V.

In FIG. 5, a combined use of the AL1 write circuit 40a and the AL2 write circuit 40b allows the writing of the definition of the presence of electrical connections for the inter AL1-AL2 antifuses 50a.

On the other hand, there is the AL3 write circuit 40c which is not shown in FIG. 5. A combined use of the AL1 write circuit 40a and the AL3 write circuit 40c allows the writing of the definition of the presence of electrical connections for the inter AL1-AL3 antifuses 50b. A combined use of the AL2 write circuit 40b and the AL3 write circuit 40c allows the writing of the definition of the presence of electrical connections for the inter AL2-AL3 antifuses 50c.

In the aluminium wiring layer AL3, a custom designed wiring provides the connection to the AL3 write circuit 40c. Furthermore, as described hereinafter with reference to FIG. 7B, there is a way of not using the AL3 write circuit 40c.

Figure 6:
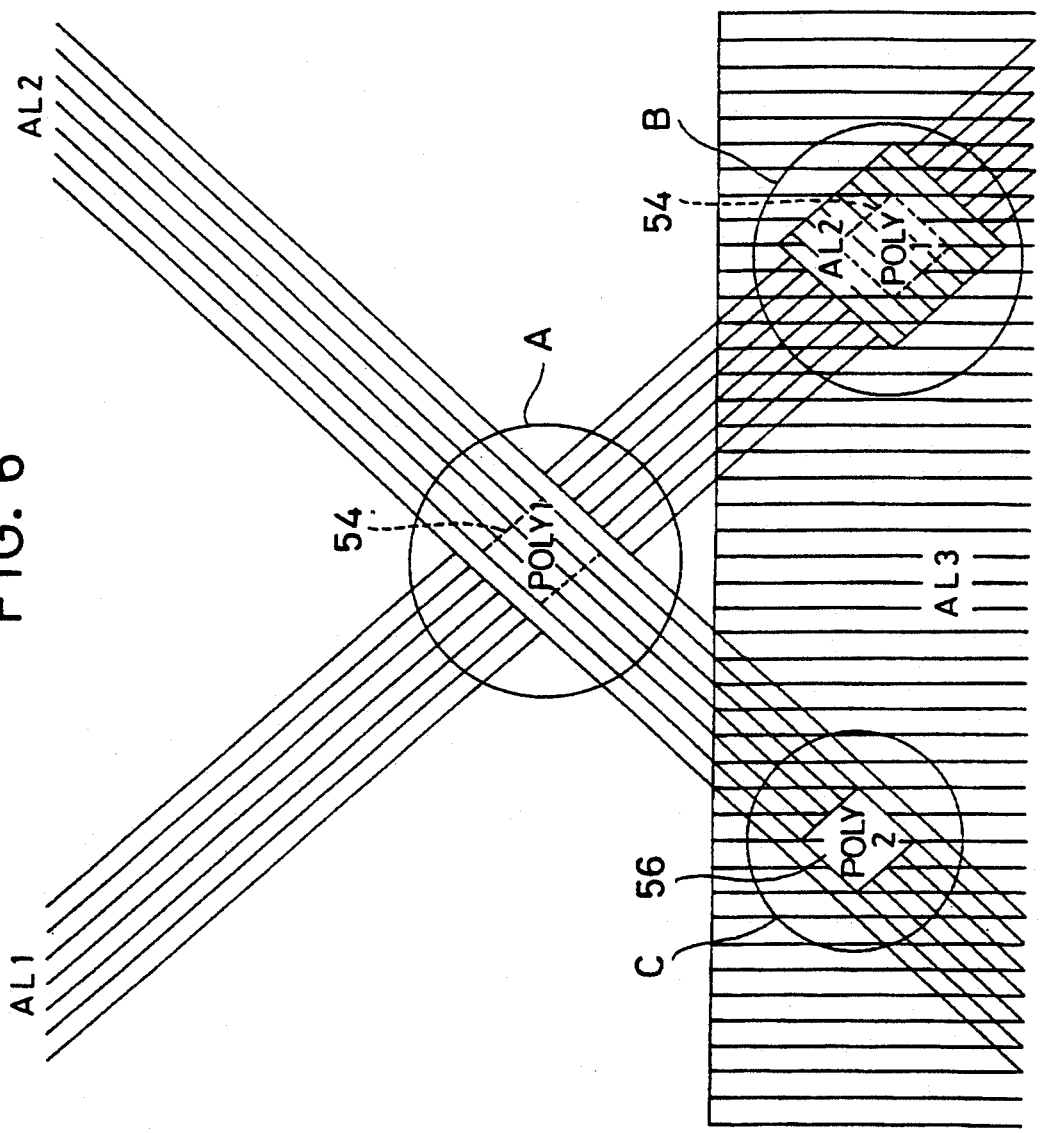
FIG. 6 is a drawing showing a top view of the sections where, in the first embodiment, a conductive track of the aluminium wiring layer AL1, a conductive track of the aluminium wiring layer AL2 and a conductive track of the aluminium wiring layer AL3 cross each other.

FIG. 6 is a top view of a total of three types of aluminium wiring layers of the present invention's first embodiment.

In FIG. 6, the aluminium wiring layer AL1 is the lowest layer, followed in upward direction by the aluminium wiring layer AL2 and the aluminium wiring layer AL3. Furthermore, in the section where the conductive track of the aluminium wiring layer AL1 and the conductive track of the aluminium wiring layer AL1 cross, namely, in the section designated by the numeral A in FIG. 6, a first polysilicon film 54, which is used as an antifuse along with the thin $SiO_2$ film, which is an electrically insulating material, is provided between the aluminium wiring layer AL1 and the aluminium wiring layer AL2. Also, in the section where the conductive track of the aluminium wiring layer AL1 and the conductive track of the aluminium wiring layer AL3 cross, namely, in the section designated by the numeral B in FIG. 6, a first polysilicon film 54, which is used as an antifuse along with the thin $SiO_2$ film, which is an electrically insulating material, is provided between the aluminium wiring layer AL1 and the aluminium wiring layer AL3. Furthermore, in the section where the conductive track of the aluminium wiring layer AL2 and the conductive track of the aluminium wiring layer AL3 cross, namely in the section designated by the numeral C in FIG. 6, a second polysilicon film 56, which is used as an antifuse along with the thin SiO$_2$ film, which is an electrically insulating material, is provided between the aluminium wiring layer AL2 and the aluminium wiring layer AL3.

The first polysilicon film 54 and the second polysilicon film 56, which are provided between the aluminium wiring layers AL1-AL3, consist of doped polysilicon, are electrically conductive and are used as antifuses along with the thin SiO$_2$ film, which is an electrically insulating material. That is, application of a fixed voltage to two different aluminium wiring layers from among the aluminium wiring layers AL1-AL3, between which the first polysilicon film 54 or the second polysilicon film 56 and the thin SiO$_2$ film are located, destroys the insulation of the thin SiO$_2$ film, and, the presence of an electrical connection can be defined by the first polysilicon film 54 or the second polysilicon film 56.

The oblique lines (AL1, AL2) and the vertical lines (AL3) in FIG. 6 do not show independent conductive tracks of the wiring, but indicate areas. That is, the areas indicate one conductive track AL1, one conductive track AL2 and one module pad (AL3).

FIG. 7A, FIG. 7B, FIG. 7C, FIG. 7D and FIG. 7E are drawings showing cross sections of antifuses used in the embodiment according to the present invention.

Figure 7A:
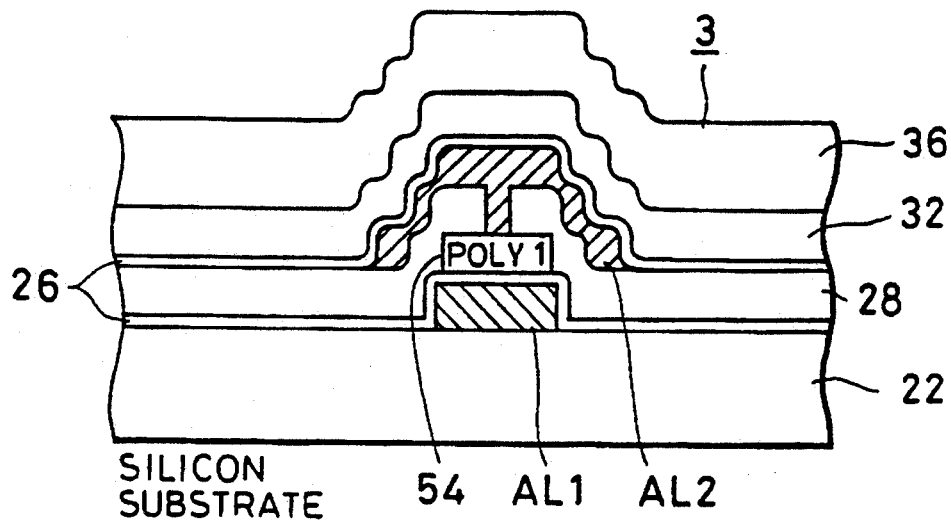
FIG. 7A is a drawing showing a cross section of an inter AL1-AL2 antifuse which is used in the embodiment according to the present invention.
Figure 7B:
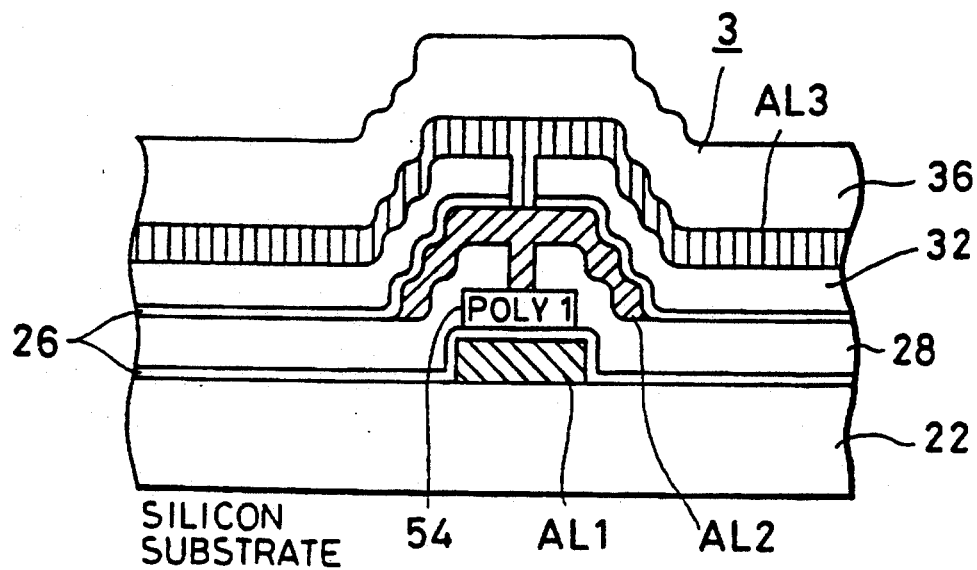
FIG. 7B is a drawing showing a cross section of an inter AL1-AL3 antifuse which is used in the embodiment according to the present invention.
Figure 7C:
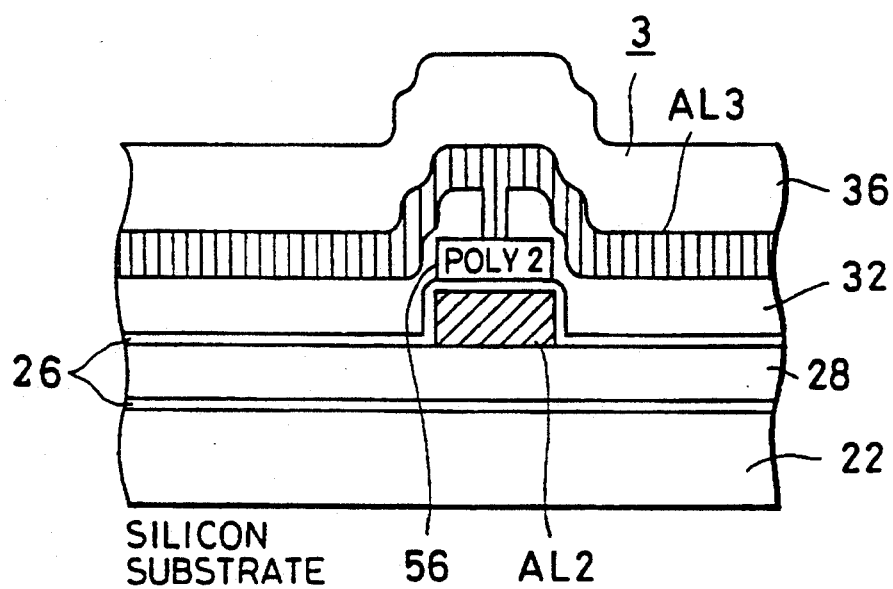
FIG. 7C, FIG. 7D and FIG. 7E are drawings showing a cross section of an inter AL2-AL3 antifuse.
Figure 7D:
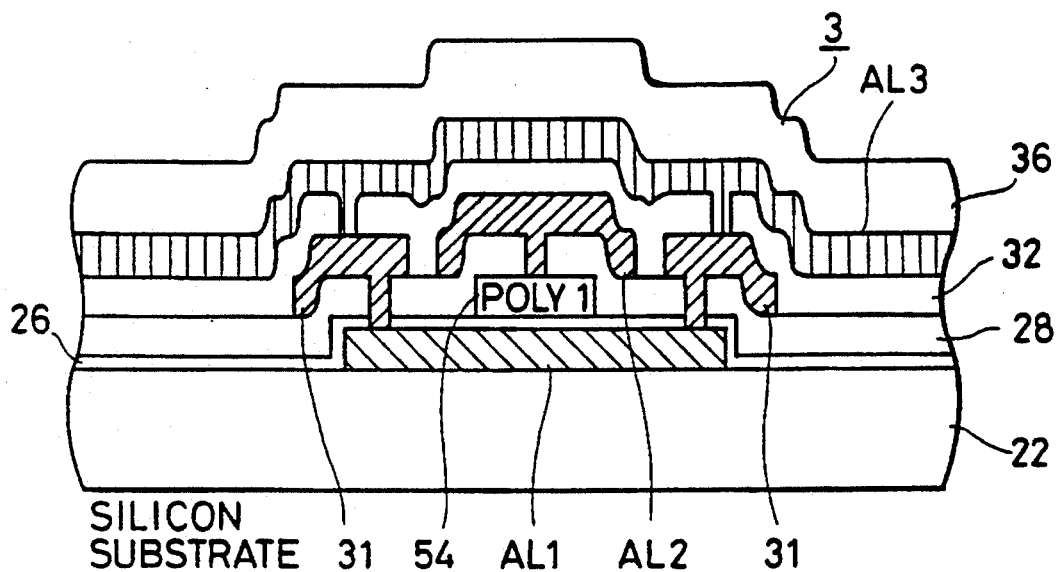
Figure 7E:
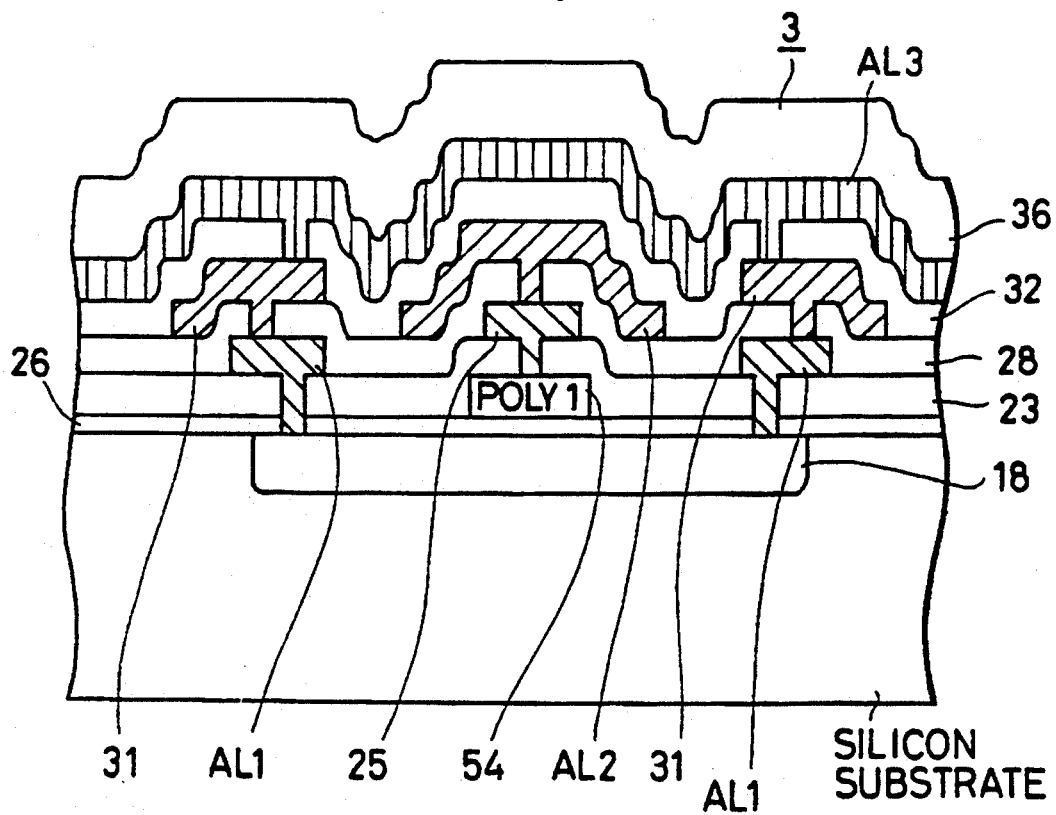

That is, FIG. 7A is a drawing showing a cross section of an inter AL1-AL2 antifuse 50a. FIG. 7B is a drawing showing a cross section of an inter AL1-A13 antifuse 50b. FIG. 7C, FIG. 7D and FIG. 7E are drawings showing a cross section of an inter AL2-AL3 antifuse 50c.

In FIG. 7A, the lowest layer of the module board 3 is a silicon substrate. Above the silicon substrate, a thick SiO$_2$ film 22, conductive tracks formed where required by means of the aluminium wiring layer AL1, a thin SiO$_2$ film 26, a first inter-layer film 28, conductive tracks formed where required by means of the aluminium wiring layer AL2, a thin SiO$_2$ film 26, a second inter-layer film 32, and a passivation film 36 are formed according to the cited order. In addition, in the section between the conductive tracks of the aluminium wiring layer AL1 and the conductive tracks of the aluminium wiring layer AL2, the first polysilicon film 54 is provided above the lower thin SiO$_2$ film 26.

In the initial state, the thin SiO$_2$ film 26, which is adjacent to the first polysilicon film 54, is electrically insulated. However, applying a fixed voltage between the conductive tracks of the aluminium wiring layer AL1 and the conductive tracks of the aluminium wiring layer AL2 destroys the insulation of the thin SiO$_2$ film 26, which allows to define the presence of electrical connections between the conductive tracks of the aluminium wiring layer AL1 and the conductive tracks of the aluminium wiring layer AL2 by the first polysilicon film 54.

In FIG. 7B, the numerals 3, 22, 26, 28, 32, 36, 54, AL1 and AL2 indicate the same parts that the same numerals of the above-described FIG. 7A indicate.

In FIG. 7B, a conductive track of the aluminium wiring layer AL3 is provided. This conductive track is connected to a conductive track of the aluminium wiring layer AL2. Accordingly, if it is defined that an electrical connection between the conductive track of the aluminium wiring layer AL1 and the conductive track of the aluminium wiring layer AL2 is present, then the conductive track of the aluminium wiring layer AL1 is also connected to the conductive track of the aluminium wiring layer AL3.

In FIG. 7C, the numerals 3, 22, 26, 28, 32, 36, AL2 and AL3 indicate the same parts that the same numerals of the above-described FIG. 7A and FIG. 7B indicate.

In FIG. 7C, there is no conductive track of the aluminium wiring layer AL1, but only conductive track of the aluminium wiring layer AL2 and conductive track of the aluminium wiring layer AL3 exist. Furthermore, in the section between the conductive track of the aluminium wiring layer AL2 and the conductive track of the aluminium wiring layer AL3, the second polysilicon film 56 is provided above the upper thin SiO$_2$ film 26.

In the initial state, the thin SiO$_2$ film 26, which is adjacent to the second polysilicon film 56, is electrically insulated. However, applying a fixed voltage between the conductive track of the aluminium wiring layer AL2 and the conductive track of the aluminium wiring layer AL3 destroys the insulation of the thin SiO$_2$ film 26, which allows the definition of the presence of electrical connections between these conductive tracks by the second polysilicon film 56.

In FIG. 7D, the numerals 3, 22, 26, 28, 32, 36, 54, AL1, AL2 and AL3 indicate the same parts that the same numerals of the above-described FIG. 7A, FIG. 7B and FIG. 7C indicate.

In FIG. 7D, the conductive track of the aluminium wiring layer AL3 is provided. This conductive track is connected to the conductive track of the aluminium wiring layer AL1 through the conductive track of an aluminium wiring layer AL2 31. Accordingly, if it is defined that an electrical connection between the conductive track of the aluminium wiring layer AL1 and the conductive track of the aluminium wiring layer AL2 which is above the first polysilicon film 54 is present, then the conductive track of the aluminium wiring layer AL2 which is above the first polysilicon film 54 is also connected to the conductive track of the aluminium wiring layer AL3.

In this case, the second polysilicon film 56 is not needed.

In FIG. 7E, the numerals 3, 26, 28, 31, 32, 36, 54, AL1, AL2 and AL3 indicate the same parts that the same numerals of the above-described FIG. 7A, FIG. 7B, FIG. 7C and FIG. 7D indicate.

In FIG. 7E, there is no thick SiO$_2$ film 22. A diffusion 18 on the silicon substrate is used as a conductive track. In the section between the conductive track of the diffusion 18 and the conductive track of the aluminium wiring layer AL2, the first polysilicon film 54 above the thin SiO$_2$ film 26 and the conductive track of an aluminium wiring layer AL1 25 which is connected to the conductive track of the aluminium wiring layer AL2 are provided. The conductive track of the aluminium wiring layer AL3 is connected to the diffusion 18 through the conductive track of the aluminium wiring layer AL2 31 and the conductive track of the aluminium wiring layer AL1. Accordingly, if it is defined that an electrical connection between the conductive track of the aluminium wiring layer AL1 and the conductive track of the aluminium wiring layer AL2 is present, then the conductive track of the aluminium wiring layer AL2 is also connected to the conductive track of the aluminium wiring layer AL3.

In this case, the second polysilicon film 56 is not needed.

This method is able to migrate into a cross section of an inter AL1-AL2 antifuse and/or an inter AL1-AL3 antifuse (not shown).

Figure 8:
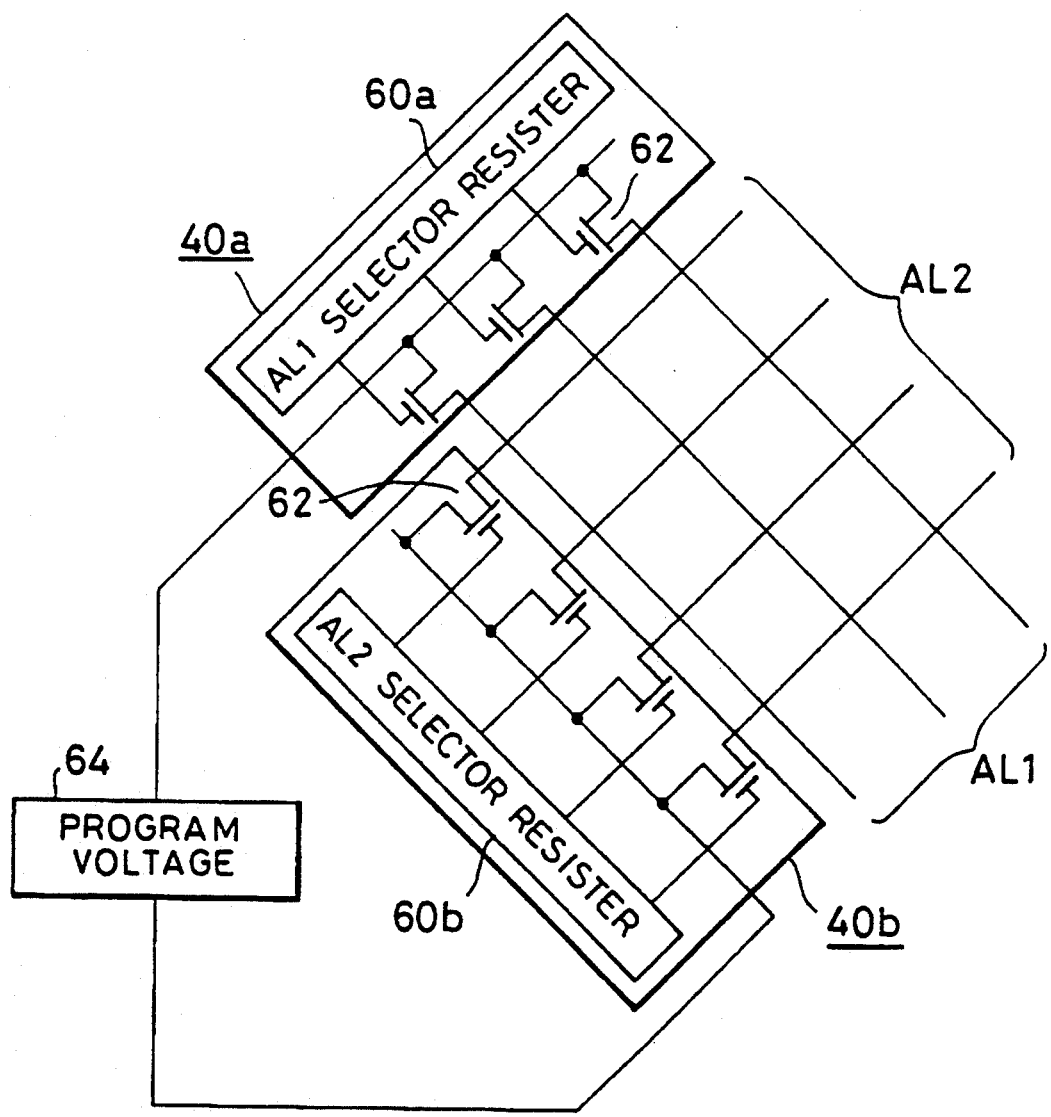
FIG. 8 is a circuit diagram for the write circuit of inter AL1-AL2 antifuses which are used in the embodiment according to the present invention.

FIG. 8 is a circuit diagram for the Al1 write circuit and the AL2 write circuit which are used in the embodiment of the present invention.

In FIG. 8, a total of only three conductive tracks from among the conductive tracks of the aluminium wiring layer AL1, a total of only four conductive tracks from among the conductive tracks of the aluminium wiring layer AL2, and only the circuits for the writing of the antifuses with regard to these conductive tracks (the definition that electrical connection is present) are shown in order to obtain a clear explanation of the operation of the circuits.

The AL1 write circuit 40a in FIG. 8 comprises an AL1 selector register 60a and a total of three switching transistors 62. Furthermore, the AL2 write circuit 40b comprises an AL2 selector register 60b and a total of four switching transistors 62.

Also, at the points of intersection between the conductive tracks of the aluminium wiring layer AL1 and the conductive tracks of the aluminium wiring layer AL2, inter AL1-AL2 antifuses 50a, which use the above-described first polysilicon film 54, are provided. That is, in FIG. 8, a total of 12 inter AL1-AL2 antifuses 50a are provided.

At the time the definition of the presence of electrical connections (writing) for each of these inter AL1-AL2 antifuses 50a is made, one of the switching transistors 62 within the AL1 write circuit 40a, which corresponds to the corresponding conductive track of the aluminium wiring layer AL1, is selected by the AL1 selector register 60a within the AL1 write circuit 40a and is switched to achieve the ON state, so that the corresponding conductive track is connected to the program voltage 64. Furthermore, at the time the definition (writing) of these inter AL1-AL2 antifuses 50a is made, one of the switching transistors 62 of the AL2 write circuit 40b, which corresponds to the corresponding conductive tracks of the aluminium wiring layer AL2, is selected by the AL2 selector register 60b of the AL2 write circuit 40b and is switched to achieve the ON state, so that the corresponding conductive track is connected to the program voltage 64.

The definition of the presence of an electrical connection is made by applying, in this manner, the program voltage 64 to the conductive track of the aluminium wiring layer AL1 and the conductive track of the aluminium wiring layer AL2, with these conductive tracks corresponding to the inter AL1-AL2 antifuse 50a for which the definition (writing) of the presence of an electrical connection is to be made.

It is possible to simultaneously define the presence of electrical connections of the antifuses for a plurality of antifuses.

FIG. 8 relates to antifuses between the conductive tracks of the aluminium wiring layer AL1, which is a standard wiring layer, and the conductive tracks of the aluminium wiring layer AL2, which also is a standard wiring layer. However, using the same configuration, it is also possible to make definitions (writing the presence of an electrical connection) for the conductive tracks of the aluminium wiring layer AL1, which is a standard wiring layer, and the conductive tracks of the aluminium wiring layer AL3, which is the custom wiring layer (this also applies to the second embodiment of the present invention). The definition (writing) of the inter AL1-AL3 antifuses 50b is made by switching the corresponding switching transistor 62 of the aluminium wiring layer AL1 to the ON state, thus making connection to be program voltage 64, and by connecting the corresponding module pads 10b (and module pins) of the aluminium wiring layer AL3 to the program voltage 64. Furthermore, as for the definition of the antifuses between the conductive tracks of the aluminium wiring layer AL2, which is a standard wiring layer, and the conductive tracks of the aluminium wiring layer AL3, which is the custom wiring layer, it is also possible to define the presence of the electrical connections by using a similar configuration.

Usually, the program voltage is provided outside of the multichip module 1. The AL1 selector register 60a and the AL2 selector register 60b are shift registers, and their data are external shift input data. In the pulse state, after specified data are set in the shift register, the program voltage is actually applied.

Figure 9:
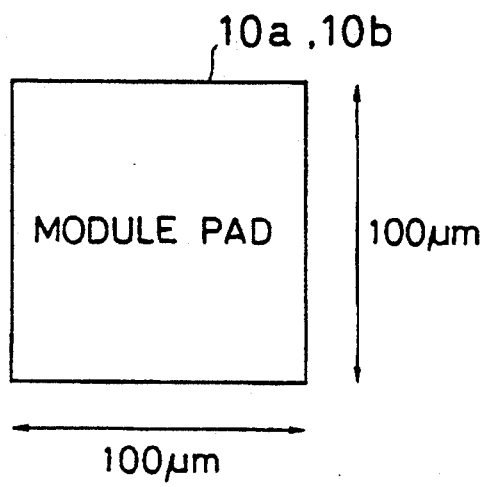
FIG. 9 is a top view of a module pad of the module board of the embodiment according to the present invention.

FIG. 9 is a top view of a module pad used on the module board 3 of the embodiment according to the present invention.

In FIG. 9, the module pad 10a (or 10b) is a 100 micro meter square.

Figure 10:
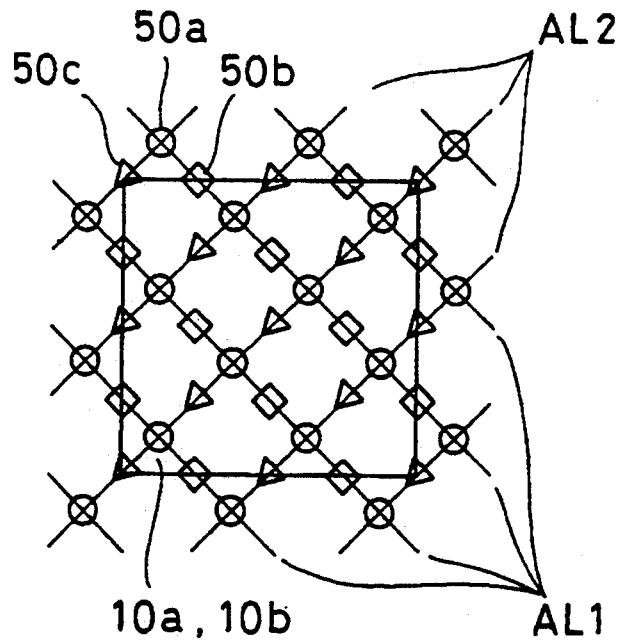
FIG. 10 is a circuit diagram for the wiring of the aluminium wiring layer AL1 and the wiring of the aluminium wiring layer AL2 of the module pad.

FIG. 10 is a circuit diagram for the standard wiring of the module pad on the module board of the embodiment according to the present invention.

In FIG. 10, the module pad 10a (or 10b) is provided with a total of 8 inter AL1-AL2 antifuses 50a, which are illustrated by circular marks, a total of 12 inter AL-1-AL3 antifuses 50b, which are illustrated by square marks, and a total of 13 inter AL2-AL3 antifuses 50c, which are illustrated by triangular marks. The module pad 10a (or 10b) is formed in the custom wiring layer which itself is the aluminium wiring layer AL3. Accordingly, using the inter AL1-AL3 antifuses 50b and the inter AL2-AL3 antifuses 50c, it is possible to connect the conductive tracks of the aluminium wiring layer AL1 and the conductive tracks of the aluminium wiring layer AL2 to the module pad 10a (or 10b). Furthermore, using the inter AL1-AL2 antifuses 50a allows a more complex wiring to be defined.

Figure 11A:
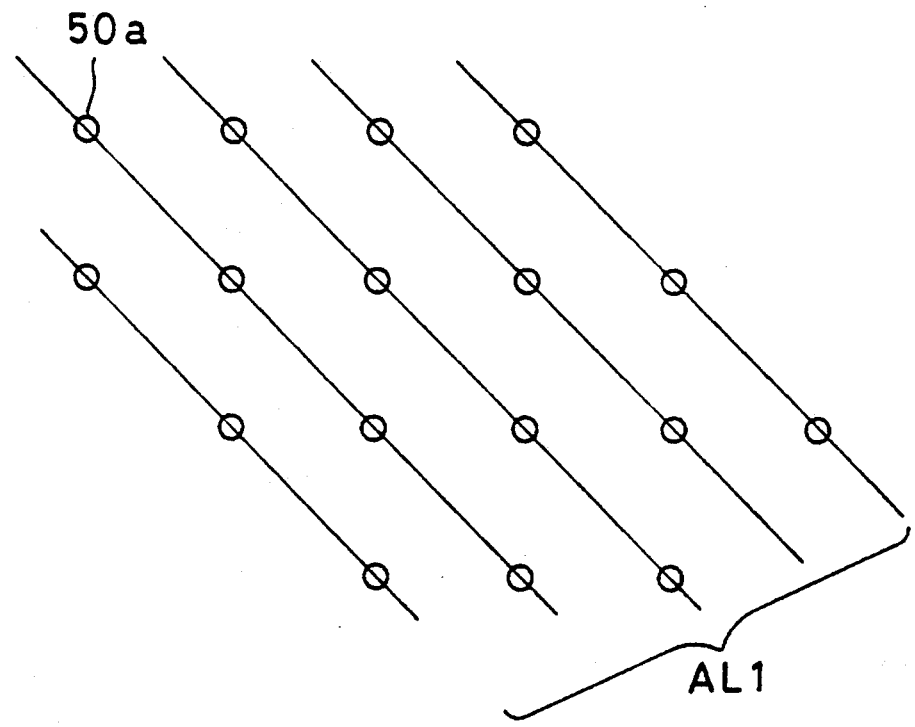
FIG. 11A is a circuit diagram of the standard wiring layer in the second embodiment according to the present invention.

FIG. 11A is a drawing showing the wiring pattern of the standard wiring layer in the second embodiment according to the present invention.

In the second embodiment, the standard wiring layers comprise only one layer, namely the aluminium wiring layer AL1.

The wiring pattern of the standard wiring layer of the second embodiment consists of straight lines having the same direction and being arranged at equal distances, as shown in FIG. 11A.

Also, in FIG. 11A, the inter AL1-AL2 antifuses 50a illustrated by circular marks are positioned uniformly at equal distances.

Figure 11B:
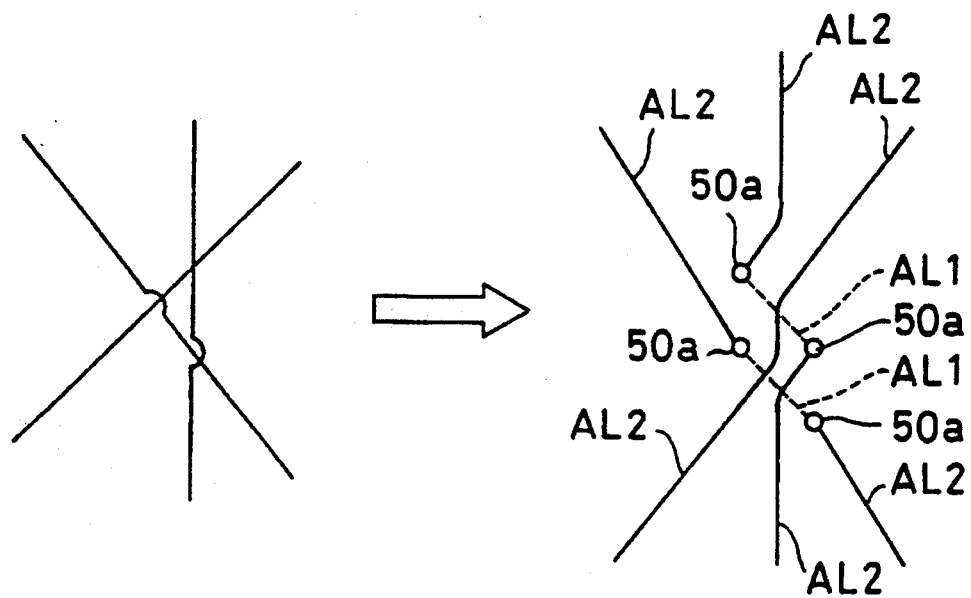
FIG. 11B is a wiring pattern drawing showing one example of a wiring pattern defined in the second embodiment.

FIG. 11B is a wiring pattern showing one example of a wiring defined in the second embodiment.

In the left wiring pattern of FIG. 11B, a total of three electrically insulated, independent conductive tracks cross each other in almost one point. In a configuration comprising only a single wiring layer, it is impossible to realize, in this manner, crossings of a plurality of electrically insulated conductive tracks.

However, as shown in the right figure of FIG. 11B, even if a crossing in almost one point of a plurality of electrically insulated, independent conductive tracks must be made, it can be realized by using one custom wiring layer in addition to the standard wiring layer with a standardized wiring pattern.

In the right figure of FIG. 11B, the broken lines AL1 are the conductive tracks of the aluminium wiring layer AL1, and the solid lines AL2 are the conductive tracks of the aluminium wiring layer AL2. Furthermore, the conductive tracks of the aluminium wiring layer AL1 and the conductive tracks of the aluminium wiring layer AL2 are connected by means of the inter AL1-AL2 antifuses 50a illustrated by circular marks.

In this way, the second embodiment according to the present invention uses a common module board, which comprises the standard wiring layers and the standardized means for defining connections (antifuses) and which meets the requirements of various multichip modules. In addition, adding only a customized custom wiring layer provides the possibility of producing the module board for use in the desired multichip module and of composing the desired multichip module.

Furthermore, in the first embodiment according to the present invention, adding, in the same manner as in the second embodiment of the present invention, only a customized custom wiring layer to the common module board provides the possibility of composing the desired multichip module. In addition, since, compared with the second embodiment, the standard wiring layer of the module board in the first embodiment is a two layer structure, it is possible to provide a more optimized wiring pattern, even if the wiring is more complex, compared with the second embodiment. For example, even if the wiring is complex, it is possible to cut down the length of each of the conductive tracks which compose the entire complex wiring.

What is claimed is:

1. A multichip module comprising:
   at least one standard wiring layer comprising standardized wiring patterns,
   a custom wiring layer on the at least one standard wiring layer and comprising customized wiring patterns and chip mounting pads,
   a plurality of connection defining means positioned in standardized installation positions and defining an electrical connection between a specified conductive track of said standard wiring layer and a specified conductive track of said custom wiring layer, and
   a plurality of wafer chips which are electrically connected to said chip mounting pads and mounted on said chip mounting pads.

2. The multichip module according to claim 1, wherein a module board is composed of said at least one standard wiring layer, said custom wiring layer and said connection defining means.

3. The multichip module according to claim 2, wherein said at least one standard wiring layer is a plurality of wiring layers of said module board, and said custom wiring layer is formed closest to a surface of said module board.

4. The multichip module according to claim 1, wherein power supply lines of said wafer chips are formed in said custom wiring layer.

5. The multichip module according to claim 1, wherein:
   the at least one standard wiring layer is a plurality of said standard wiring layers, and
   the plurality of connection defining means positioned in standardized installation positions and defining the electrical connection between a specified conductive track of one of the plurality of standard wiring layers and at least one of the following:
   a specified conductive track of another one of the plurality of standard wiring layers or a specified conductive track of the custom wiring layer; and a specified conductive track of a standard wiring layer.

6. The multichip module according to claim 5, wherein each standardized wiring pattern of said plurality of wiring layers has at least different wiring direction angles.

7. The multichip module according to claim 1, wherein antifuses are used as said connection defining means.

8. The multichip module according to claim 7, wherein said antifuses consist of a polysilicon film and a thin $SiO_2$ film which are positioned between different wiring layers.

9. The multichip module according to claim 1, wherein said multichip module is provided with a standardized active element.

10. The multichip module according to claim 1, wherein installation positions of said chip mounting pads are standardized.

* * * * *

UNITED STATES PATENT AND TRADEMARK OFFICE
CERTIFICATE OF CORRECTION

PATENT NO. : 5,258,891
DATED : November 2, 1993
INVENTOR(S) : Norimitsu Sako

It is certified that error appears in the above-identified patent and that said Letters Patent is hereby corrected as shown below:

Column 8, line 50, "AL1" should be corrected to —AL2—.

Column 9, line 28, "AL1 - A13" should be corrected to —AL1 - AL3—.

Column 11, Line 1, "All" should be corrected to —AL1—.

Signed and Sealed this

Twelfth Day of July, 1994

Attest:

BRUCE LEHMAN

Attesting Officer     Commissioner of Patents and Trademarks